US012663466B2

(12) United States Patent
Vanderwerf et al.

(10) Patent No.: US 12,663,466 B2
(45) Date of Patent: Jun. 23, 2026

(54) VOICE COIL LEAF SPRING PROBER

(71) Applicant: MACOM Technology Solutions Holdings, Inc., Lowell, MA (US)

(72) Inventors: Timothy James Vanderwerf, Ithaca, NY (US); Alex G Chernyakov, Ithaca, NY (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 390 days.

(21) Appl. No.: 18/471,270

(22) Filed: Sep. 20, 2023

(65) Prior Publication Data

US 2024/0125847 A1 Apr. 18, 2024

Related U.S. Application Data

(60) Provisional application No. 63/415,606, filed on Oct. 12, 2022.

(51) Int. Cl.
  *G01R 31/28* (2006.01)
  *G01R 1/067* (2006.01)
  *G01R 1/073* (2006.01)

(52) U.S. Cl.
  CPC ..... *G01R 31/2887* (2013.01); *G01R 1/06722* (2013.01); *G01R 1/06733* (2013.01); *G01R 1/07392* (2013.01); *G01R 31/2891* (2013.01); *G01R 31/2831* (2013.01)

(58) Field of Classification Search
  CPC .................................................. G01R 31/00
  See application file for complete search history.

(56) References Cited

U.S. PATENT DOCUMENTS

| | | | | | |
|---|---|---|---|---|---|
| 3,551,807 | A | | 12/1970 | Kulischenko | |
| 4,123,706 | A | | 10/1978 | Roch | |
| 5,944,562 | A | * | 8/1999 | Christensson | H01R 13/035 |
| | | | | | 607/152 |
| 6,005,251 | A | * | 12/1999 | Alexander | G01Q 30/025 |
| | | | | | 250/442.11 |

FOREIGN PATENT DOCUMENTS

| | | | |
|---|---|---|---|
| JP | 48-4910 | Y1 | 2/1973 |
| JP | 61-50048 | A | 3/1986 |
| JP | 1-232272 | A | 9/1989 |
| JP | 2003-84024 | A | 3/2003 |
| JP | 2012-54526 | A | 3/2012 |
| WO | WO2020063682 | A2 | 8/2002 |

OTHER PUBLICATIONS

International Search Report and Written Opinion of the International Searching Aurhority; Dec. 5, 2023.

* cited by examiner

*Primary Examiner* — Tung X Nguyen
(74) *Attorney, Agent, or Firm* — Jeffery J Brosemer

(57) ABSTRACT

Aspects of the present disclosure describe a voice coil actuated leaf spring prober that advantageously may be operated to probe every individual device (device under test—DUT) comprising a contemporary wafer. The prober according to aspects of the present disclosure includes one or more probe needles attached in an electrically isolated arrangement to an end of a horizontal-U-shaped, recurved, leaf spring arrangement. The prober includes—for example—a voice coil actuator positioned within the horizontal-U-shaped portion of the leaf spring which—when operated—results in leaf spring displacement and probe needle movement such that it may mechanically/electrically contact the DUT.

20 Claims, 11 Drawing Sheets

Top
Perspective
View

Flat
Spring

V-shaped groove

Cross-
Sectional
View

Flat
Spring

V-shaped groove

VOICE COIL LEAF SPRING PROBER

CROSS REFERENCE TO RELATED APPLICATIONS

This application claims the benefit of U.S. Provisional Patent Application Ser. No. 63/415,606 filed 12 Oct. 2022, the entire contents of which is incorporated by reference as if set forth at length herein.

TECHNICAL FIELD

This disclosure relates generally to integrated circuit testing. More specifically, it relates to systems, methods, and structures including a voice coil leaf spring prober that provides precise, reliable, reproduceable, non-damaging probing/testing of very high-density integrated circuits at wafer-scale.

BACKGROUND

Trends in the design and manufacture of integrated circuits—and in particular large scale, or very large-scale integrated circuits—show a continuous move towards a higher density of smaller devices on increasing wafer dimensions. Such trends have resulted in an increase in the complexity involved with testing of the integrated circuits and components thereof. Generally, it has been desirable to test the integrated circuits at wafer-scale—before any terminal leads have been applied thereto. Due to the minute size of the circuits being tested, it is necessary to provide small probes which can be precisely located relative to a workpiece bearing/holding/securing the structures/circuits to be tested. As is apparent from this background discussion, systems, methods, and structures that facilitate the probing/testing of very high-density integrated circuits at wafer-scale would be a welcome addition to the art.

SUMMARY

An advance in the art is made according to aspects of the present disclosure directed to a voice coil actuated leaf spring prober that advantageously may be operated to probe every individual device (device under test—DUT) comprising a contemporary wafer.

In an illustrative embodiment, a prober according to aspects of the present disclosure includes one or more probe needles attached in an electrically isolated arrangement to an end of a horizontal-U-shaped, recurved, leaf spring arrangement. The prober includes—for example—a voice coil actuator positioned within the horizontal-U-shaped portion of the leaf spring which—when operated—results in leaf spring displacement and probe needle movement such that it may mechanically/electrically contact the DUT.

In another illustrative embodiment, a prober according to aspects of the present disclosure includes one or more probe needles attached in an electrically isolated arrangement to an end of a horizontal leaf spring arrangement. The prober includes—for example—a voice coil actuator positioned above a portion of the leaf spring which—when operated—results in leaf spring displacement and probe needle movement such that it may mechanically/electrically contact the DUT.

In sharp contrast to the prior art, a needle prober according to the present disclosure permits simultaneous, unobstructed overhead (top view) observation/imaging of a positioning/probing/testing operation even for configurations including multiple probe needles.

In further contrast to the prior art, the attachment of the probe needle(s) to the leaf spring(s) results in a "flat" angle of the probe needle (~<75 degrees from horizontal) providing greater access to the DUT. This flat angle advantageously provides a "wipe" or "scrubbing" on a contacted electrical pad of the DUT thereby ensuring a reproduceable electrical connection between the probe needle and the DUT, without unnecessarily scratching or damaging the DUT. Of further contrast to the prior art, the probe needle is "unsheathed", thereby providing greater mechanical simplicity.

The voice coil actuator, when positioned within the U-shape of the leaf spring such that a displacement force generated by operation of the voice coil actuator is created between the two "arms" of the U-shape and produces a downward vertical displacement of the needle probe attached to the distal end of the U-shaped leaf spring.

A dimple is preferably formed at a point in the U-shaped leaf spring that receives a movable piston/shaft of the voice coil actuator such that the mechanical relationship between the actuator and the leaf spring is maintained during operation/displacement.

Finally, the U-shaped leaf spring and electrical insulator that mounts the probe needle to the leaf spring are made from selected materials that provide a precise, reliable, reproduceable movement/displacement for long operational lifetime.

When configured in the other embodiment, the horizontal leaf spring may include a V-shaped groove formed substantially along a central axis of the leaf spring. Similar to the U-shaped leaf spring arrangement, the V-shaped groove of the horizontal leaf spring arrangement receives the movable piston/shaft of a voice coil actuator. The voice coil actuator is mounted in a fixed position above the horizontal leaf spring such that a displacement force generated by operation of the voice coil actuator produces a downward vertical displacement of the needle probe attached to the distal end of the horizontal leaf spring.

BRIEF DESCRIPTION OF THE DRAWING

A more complete understanding of the present disclosure may be realized by reference to the accompanying drawing in which.

DESCRIPTION

Figure 1:
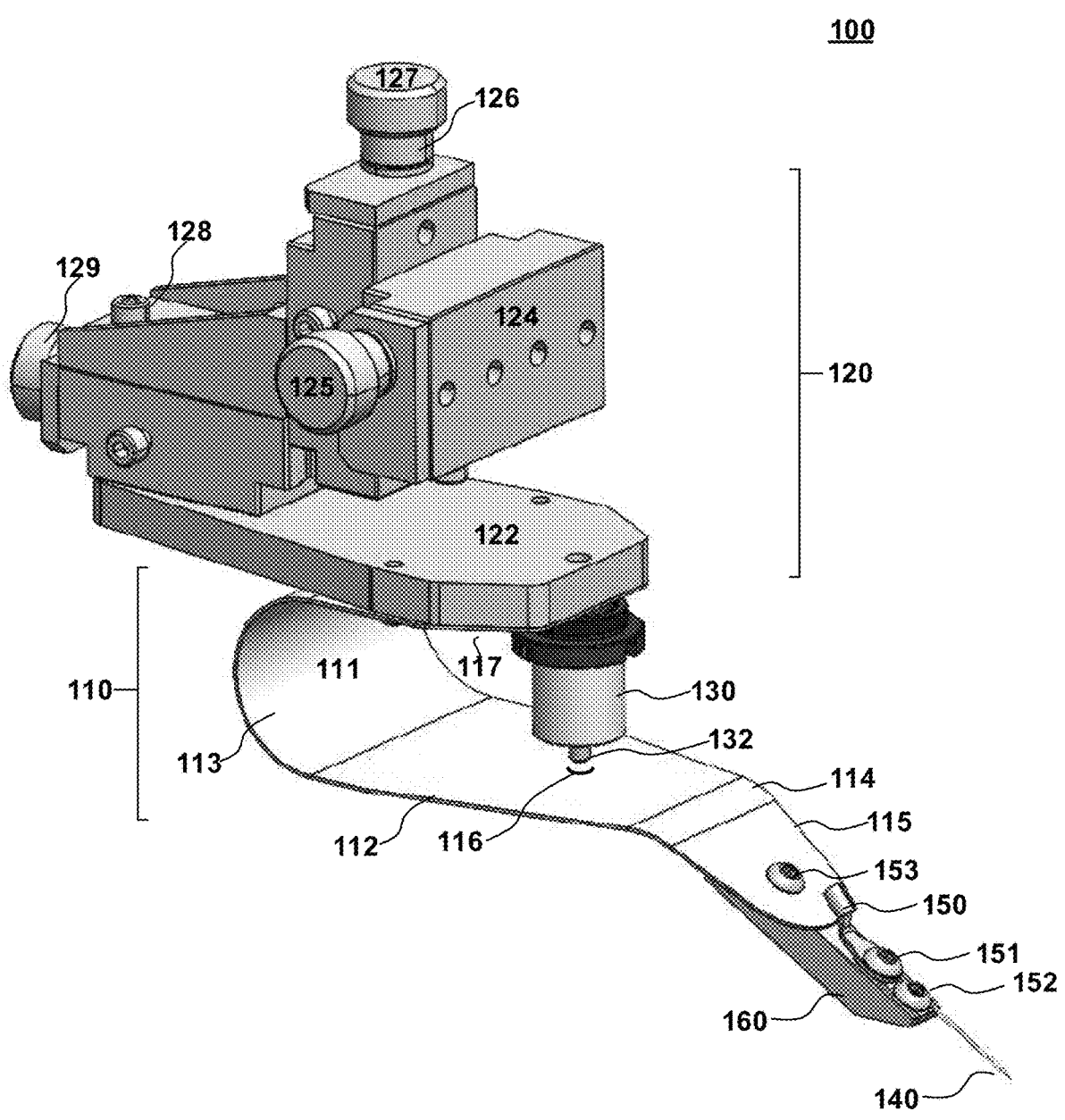
FIG. 1 is a 3-D, perspective, schematic diagram of an illustrative leaf spring prober according to aspects of the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGs comprising the drawing are not drawn to scale.

FIG. 1 is a 3-D, perspective, schematic diagram of an illustrative leaf spring prober according to aspects of the present disclosure. With reference to that FIG. 1 it may be observed that such illustrative needle prober 110 generally includes a leaf spring 111, and a probe needle 140 mechanically connected to a distal end of the leaf spring, and an actuator 130.

The needle prober 110 is shown mechanically connected to a stage 122 of an X-Y-Z stage platform 120 which provides X-Y-Z directional displacement of the stage platform and needle prober by three adjustors 128, 126, and 124, respectively through the effect of rotatable knobs 129, 127, and 125.

The illustrative leaf spring 111 is shown having an extended, horizontal, "U-shape" that includes a proximal top portion 117, a mid-portion 112, and a U-shaped curved portion 113 connecting the proximal portion and the mid-portion such that the extended U-shape is formed. At a distal end of the mid-portion a recurve 114 is formed extending to a distal spring tip 115 to which a probe needle 140 is mechanically attached via electrical insulator attachment 160. When so attached, the probe needle is electrically isolated from the leaf spring. Electrical connection to the probe needle may be made through electrical connector 150, which is in mechanical/electrical connection to the probe needle and may secure it to electrical insulator attachment.

Actuator, 130 is shown fixed in position "within" the extended U-shape of the leaf spring such that when actuator is activated, actuator piston/shaft 132 is extended such that the actuator urges apart the proximal top portion 117 and the mid-portion 112 of the leaf spring thereby providing—in this illustrative arrangement as shown in the figure—a downward deflection of portions of the leaf spring and attached probe needle.

In an illustrative arrangement such as that shown, a single, voice coil actuator may be employed to provide the vertical deflection of the leaf spring. Note that as shown in the figure, a "dimple"/receiver 116 is formed/disposed on a surface of the mid-portion of the leaf spring to receive the actuator piston/shaft when that piston/shaft is extended. In this manner, the dimple will maintain a mechanical relationship between the actuator piston/shaft and the leaf spring such that a more predictable deflection of the leaf spring is produced.

We note that while we use the term "dimple" to describe feature formed on the surface of the mid-portion of the leaf spring to receive the actuator piston/shaft when that piston/shaft is extended as a result of actuator operation, the shape of the "dimple" can be any that sufficiently receives the piston/shaft such that an effective mechanical displacement is achieved.

Shown further in the figure is the recurve 114 located at distal end of mid-portion 112 that produces a downward pointing deflection of probe needle while maintaining mechanical "flex" to the distal end of the leaf spring and probe needle. As will be appreciated by those skilled in the art, when the probe needle is so attached to the downward-directed distal end portion of leaf spring through the effect of recurve, a combined flex is created from the leaf spring, the needle, and even the electrical insulator attachment if/when the insulator attachment is constructed from a suitably flexible material. Note that in an illustrative embodiment, the electrical insulator attachment may be made from machined aluminum nitride that advantageously exhibits a coefficient of thermal expansion matched to a wafer that includes devices under test.

As shown in the figure, the attachment of the probe needle to the leaf spring and the recurve shape results in a "flat" angle of the needle (~<75 degrees from horizontal) which advantageously provides greater access to a device under test. This flat angle provides a "wipe" of the probe needle on an electrical on the device under test thereby ensuring a reproduceable electrical connection between the probe needle and the device under test, without scratching or damaging the device under test.

We note that the leaf spring may be constructed from suitable material that provides adequate flexibility, durability, and thermal stability. Since our prober will operate at wafer scale comprising ~100K devices requiring ~300K probe needle "touch-downs" per test at temperatures over −40 to +100 degrees Celsius, reliability, repeatability and speed are critical characteristics. Accordingly, material tolerances to meet these requirements are stringent. Materials such as Invar 36 Nickel alloy is determined to be suitable for a leaf spring according to aspects of the present disclosure. Likewise, and as previously noted, aluminum nitride exhibiting a coefficient of thermal expansion matched to wafer(s) to be tested is suitable as insulating attachment for probe needle.

Operationally, a device under test (not specifically shown in this figure)—which as we have noted may be a device that is one of many formed on a single wafer—is positioned proximate to the needle prober according to aspects of the present disclosure. As we shall later show, multiple needle probers may be employed in a single probe tester.

In the illustrative embodiment shown in the FIG. 1 two screws (151, 152) are shown securing the probe needle to the aluminum nitride insulating attachment. One screw is shown securing a ring or other electrical terminal to the probe needle and, it is through such electrical terminal that electrical test signals are sent/received to/from the device under test via the probe needle.

When the voice coil actuator is energized, a magnet causes extension of the actuator piston/shaft which in turn contacts the lower mid-portion of the u-shaped leaf spring and imparts a downward force on that lower mid-portion of the u-shaped leaf spring. This downward force results in the probe needle to be deflected downward and contact the device under test. Note that the force is counteracted once the probe needle contacts the device under test (wafer).

Note further that in this configuration shown, the voice coil actuator is positioned "inside" or "between" the top portion 117 and the mid-portion 112 of the leaf spring. As such, when the actuator operates, it urges apart the top portion and the mid-portion by simultaneously applying opposite force(s) to each of those portions of the leaf spring. Such arrangement advantageously provides for a compact, reliable, reproduceable, and durable structure.

As will be understood and appreciated by those skilled in the art, through testing, the downward force of the probe needle resulting from actuator operation and leaf spring displacement, can be set to prevent probe overtravel and damage to the DUI. As we shah show, the shape of the needle prober is such that it can be arrayed at angles (i.e., 45 degrees or other angles as necessary for test device configurations) around an individual device under test or a wafer including many hundreds of such devices wherein the wafer of any of several known sizes. As will be appreciated, needle probers may be constructed/configured with leaf springs of different lengths/widths/geometries to accommodate wafers of different sizes including those greater than 11 inches or more.

Note that in addition to a system with multiple needle probers, a needle prober with multiple probe needles at a distal end of a single leaf spring may be configured. In such a configuration, the end of the leaf spring may include multiple insulators each having a probe needle. It is also possible to have a single insulator structure hold multiple, electrically isolated probe needles if such an arrangement is compatible with a device to be tested. When multiple probe needles are configured with a single leaf spring, such arrangement allows for the operation of the multiple probe needles with a single actuator.

We note—and as will be understood and appreciated by those skilled in the art—that needle probers according to aspects of the present disclosure—due to their mechanical flexibility as described, advantageously minimize the amount of scratching—commonly referred to as "scrubbing," which takes place between the probe needle tip and the device under test.

On the other hand, it is often desirable not to eliminate such scrubbing as it may be that a face of the device being tested is oxidized and it is necessary for the probe needle tip to scratch through the oxide in order to ensure proper electrical connection and therefore to conduct a test properly.

In other words, some scrubbing is desirable, but it is preferable that the scrubbing be confined to a very small area to minimize damage to the surface of the device to be tested. Advantageously, systems, methods, and devices according to aspects of the present disclosure provide such desirable scrubbing.

Figure 2:
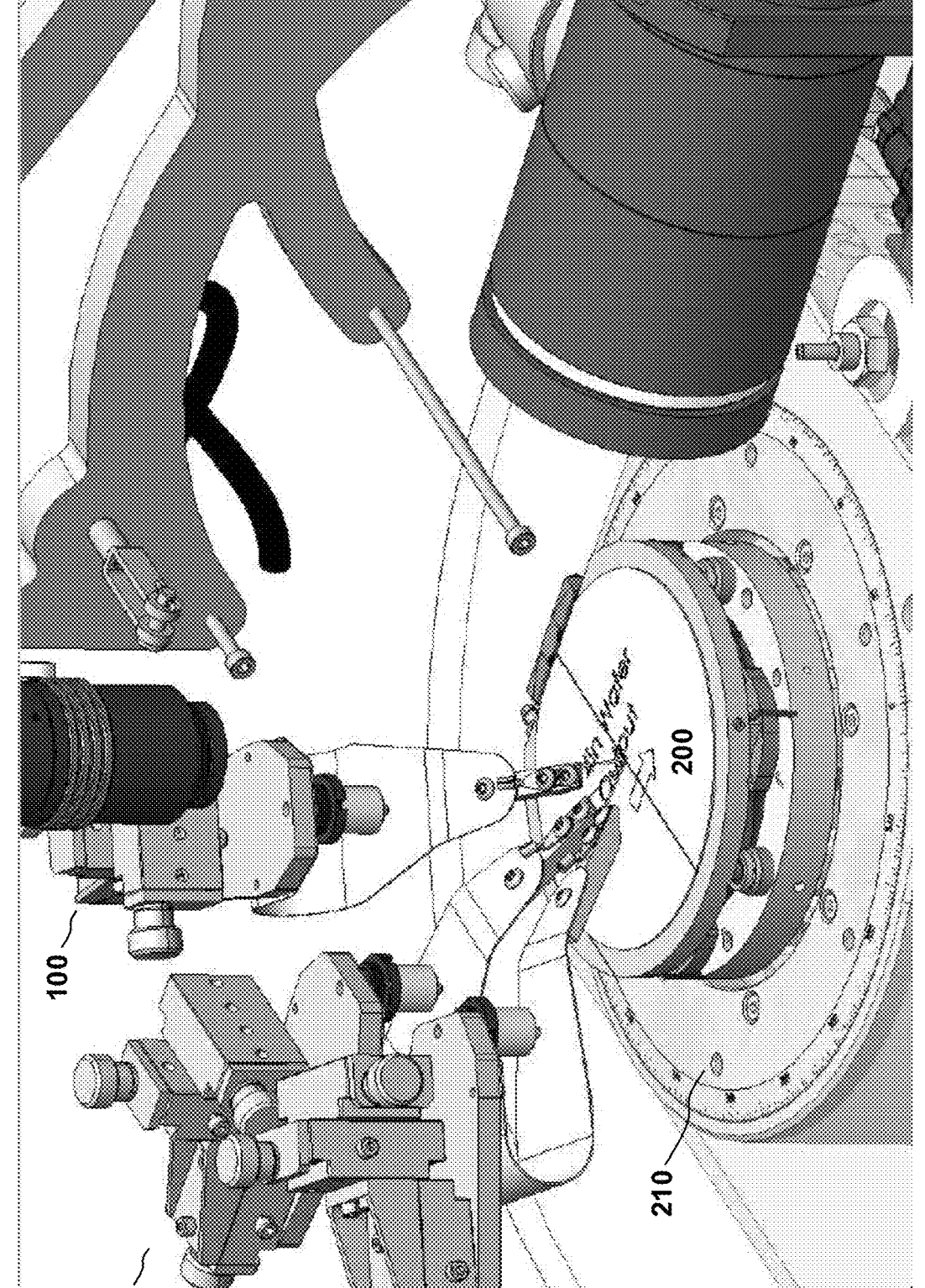
FIG. 2 is a 3-D, perspective, schematic diagram of an illustrative multi-prober arrangement including multiple, leaf spring probers of FIG. 1 according to aspects of the present disclosure.

FIG. 2 is a 3-D, perspective, schematic diagram of an illustrative multi-prober arrangement including multiple, leaf spring probers of FIG. 1 according to aspects of the present disclosure.

With reference to that figure, it may be observed that multiple (3), leaf spring probers (100) are shown arranged around a rotary fixture/turntable 210 to which a wafer 200 is secured. As will be appreciated, when so positioned, one or more devices located on the wafer may be sequentially tested by this single configuration. As we shall show and describe further, and due to the advantageously physical geometry of the individual leaf spring probers, an unobstructed overhead view is achieved such that an overhead observation/imaging system may be employed.

When so arranged, the rotary turntable may rotate and the individual needle probers may be adjusted to test any one of a plurality of individual die/chips comprising a physical wafer may be tested.

Figure 3:
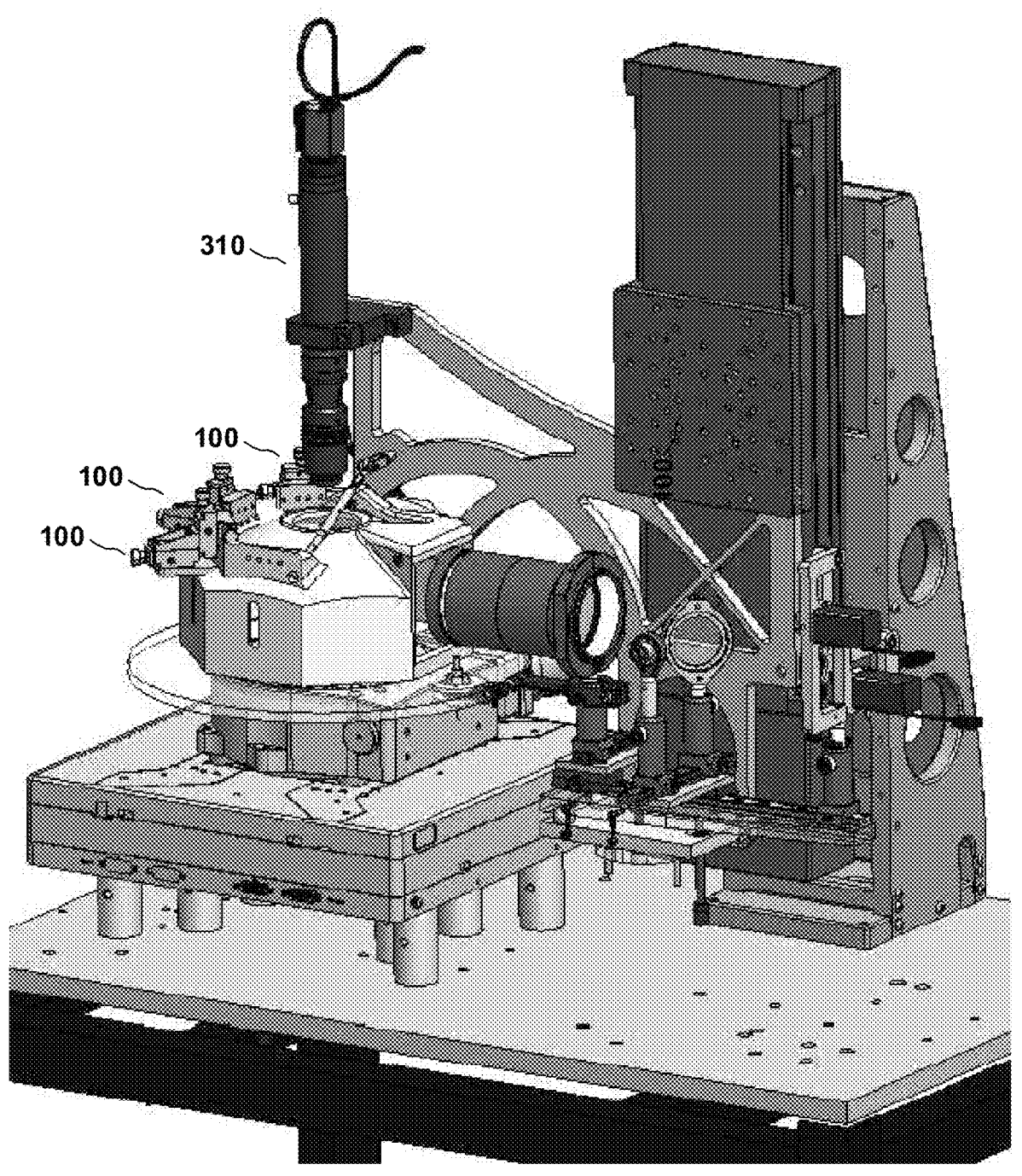
FIG. 3 is a 3-D, perspective, schematic diagram of the arrangement of FIG. 2 as part of an overall testing/inspection system including overhead visual imaging system according to aspects of the present disclosure.

FIG. 3 is a 3-D, perspective, schematic diagram of the arrangement of FIG. 2 as part of an overall testing/inspection system including overhead visual imaging system according to aspects of the present disclosure.

As illustratively shown in this figure, an overhead inspection/imaging system 310 is shown positioned above the multiple needle probers and device under test. Note further that the arrangement shown in the figure includes an enclosure for the needle probers and wafer while providing overhead viewing via top site glass/window. As will be understood and appreciated by those skilled in the art, such an enclosed test arrangement may be desirable for devices that are susceptible to environmental conditions such as thermal gradients. Such arrangement highlights the flexibility of needle probers according to aspects of the present disclosure.

Figure 4:
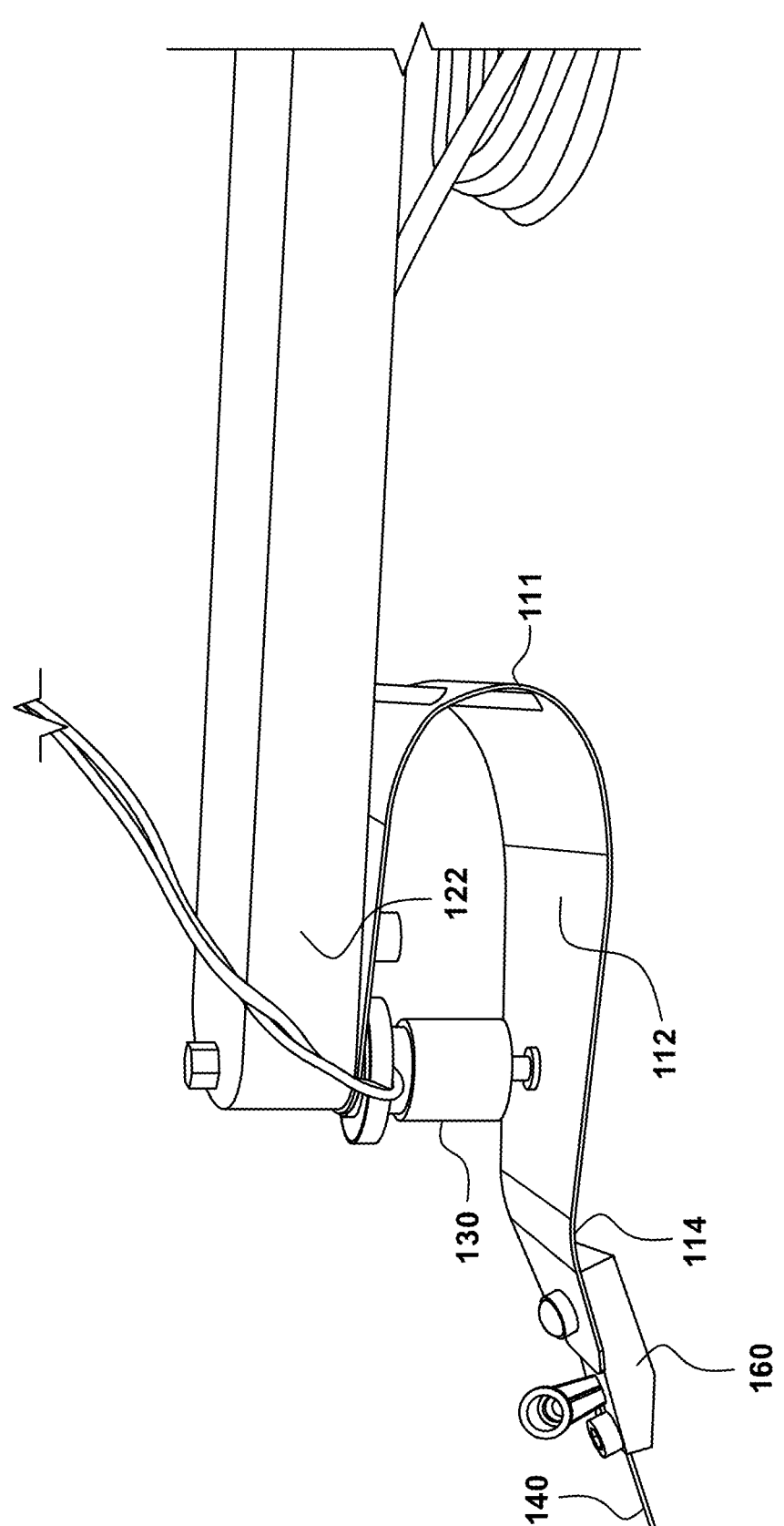
FIG. 4 shows a side view of an illustrative prototype leaf spring prober according to aspects of the present disclosure.

FIG. 4 shows a side view of an illustrative prototype leaf spring prober according to aspects of the present disclosure. Of particular interest in this figure, the location of the voice coil actuator 130 is shown positioned between the two "arms" of the U-shaped leaf spring 111. As such, when the actuator is operated, it urges apart the two arms by applying opposite force(s) to each of the two arms resulting in a vertical deflection of the lower arm since the upper arm is fixed to the stage 122 located above the actuator 130.

Figure 5:
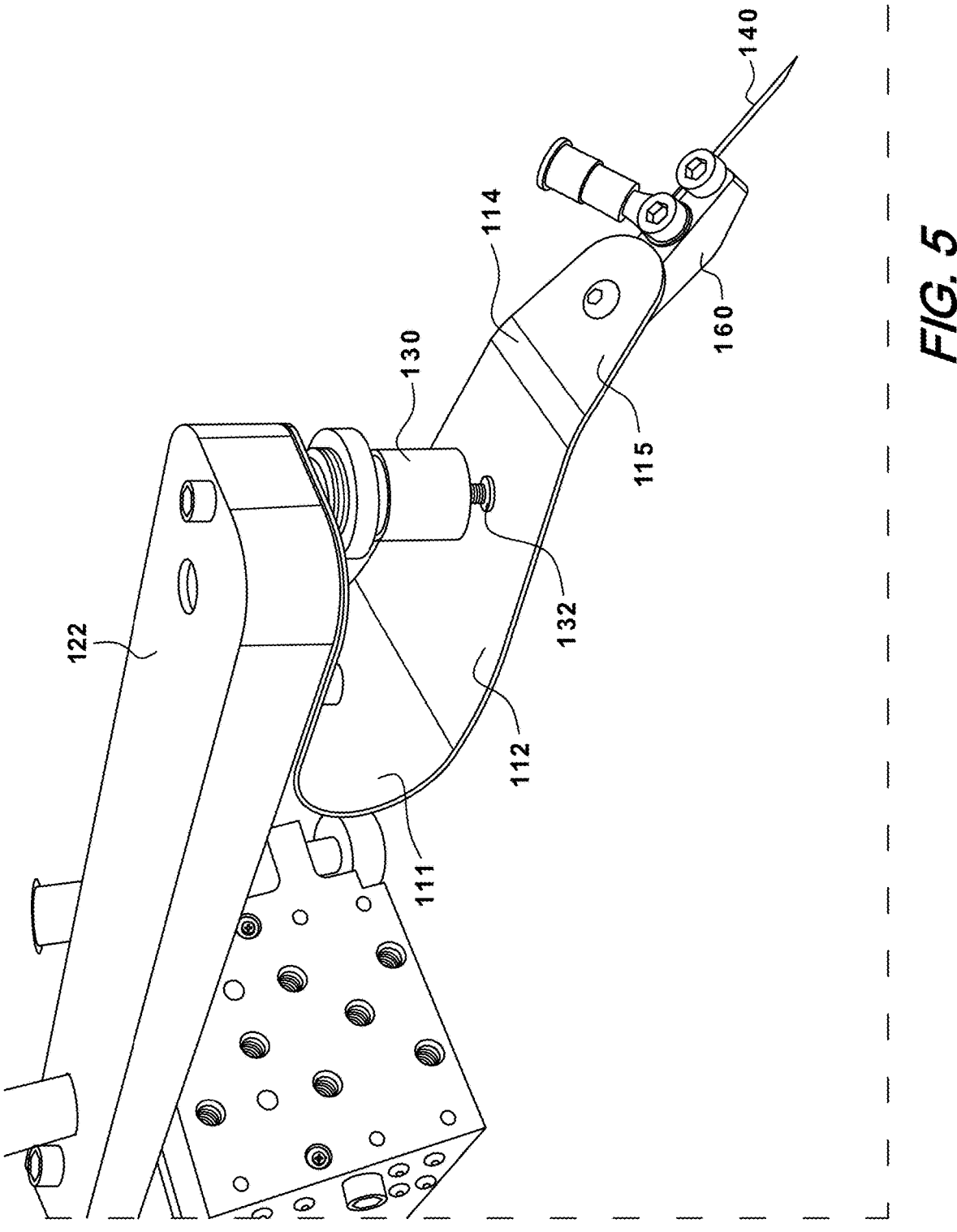
FIG. 5 shows a perspective view of the illustrative prototype leaf spring prober of FIG. 4 according to aspects of the present disclosure.

FIG. 5 shows a perspective view of the illustrative prototype leaf spring prober of FIG. 4 according to aspects of the present disclosure. As illustrated in this prototype configuration, a dimple 132 is formed in the mid-portion of the leaf spring "arm" that receives the actuator piston/rod. Such dimple provides a secure, reproduceable mechanical contact/receiving point for the actuator piston/rod.

Figure 6:
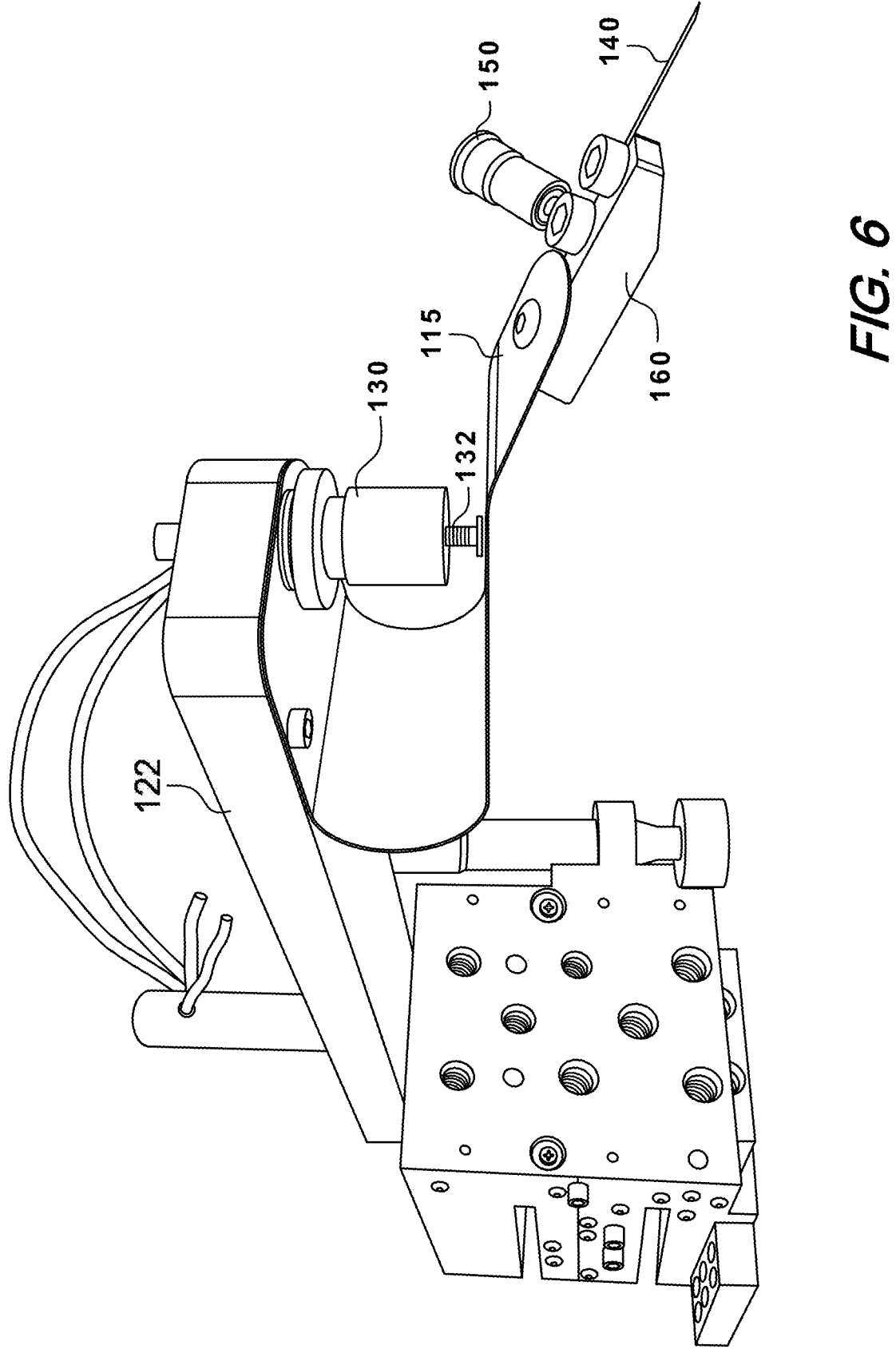
FIG. 6 shows another perspective view of the illustrative prototype leaf spring prober of FIG. 4 according to aspects of the present disclosure.

FIG. 6 shows another perspective view of the illustrative prototype leaf spring prober of FIG. 4 according to aspects of the present disclosure. Of particular interest in this figure is the recurve end portion 115 which provides a downward (toward DUT) direction to the insulator 160 and needle 140 mounted thereto. Such an arrangement provides for a relatively flat approach angle of the needle while still providing sufficient wipe action when needle contacts a DUT. As previously noted, such an end portion allows for a broad approach angle of the needle to a DUT and is configurable depending on the type/configuration of the DUT. As a result, predictable, reproduceable, mechanical/electrical contact may be made between the needle and the DUT while not damaging the DUT.

Figure 7:
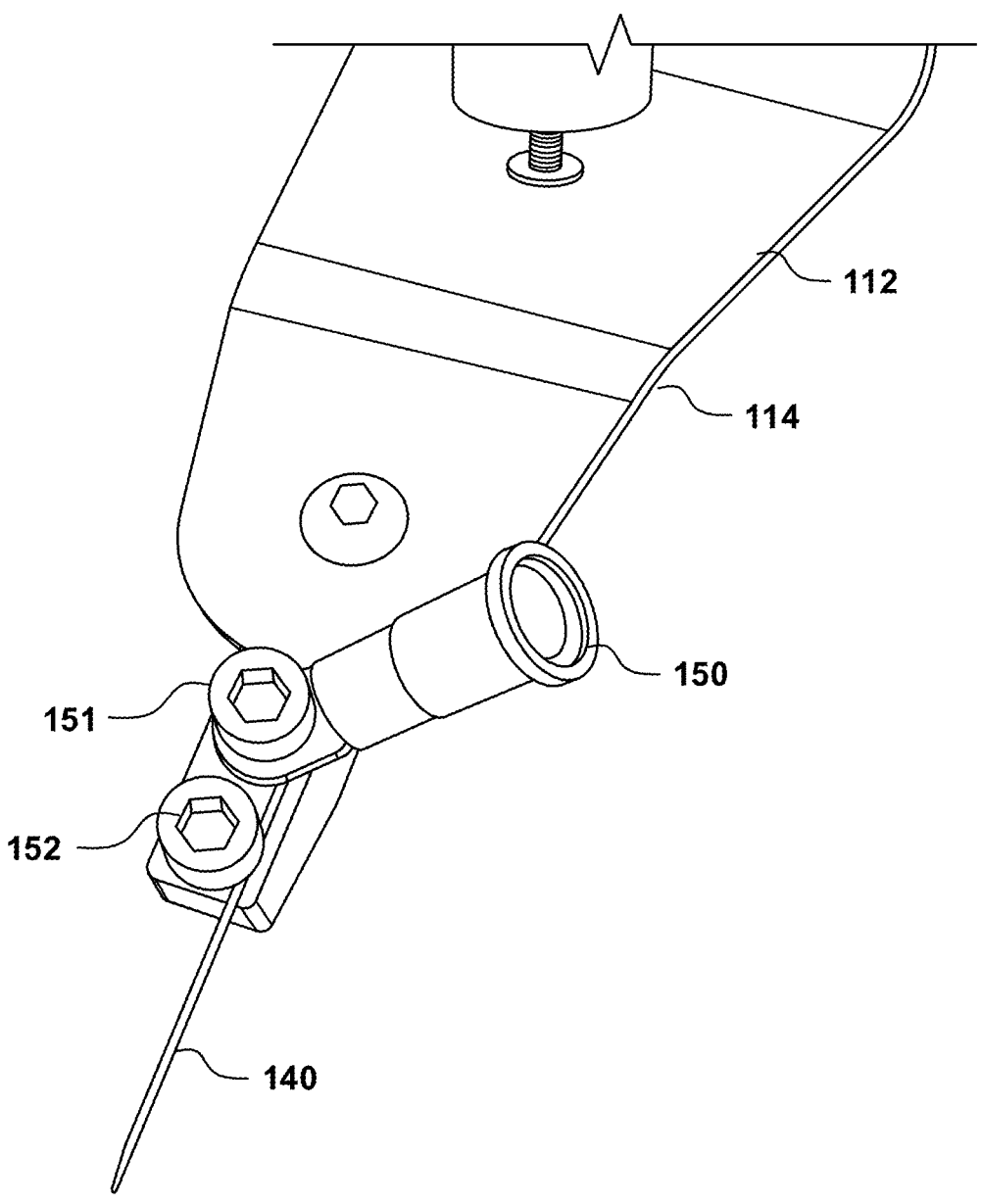
FIG. 7 shows a close-up view of a needle probe of the illustrative prototype leaf spring prober of FIG. 4 according to aspects of the present disclosure.

FIG. 7 shows a close-up perspective view a needle probe of the illustrative prototype leaf spring prober of FIG. 4 according to aspects of the present disclosure. As may be observed and understood from inspecting this figure, the needle 140 is "unsheathed" and provides a mechanical simplicity and ensures a reproduceable and reliable mechanical/electrical contact between the needle probe and a DUT electrical pad. We note that while the needle is shown unsheathed, those skilled in the art will understand and appreciate that some applications it may be desirable to insulate a portion of the length of the needle. In such applications, any known insulating materials may be employed.

Figure 8:
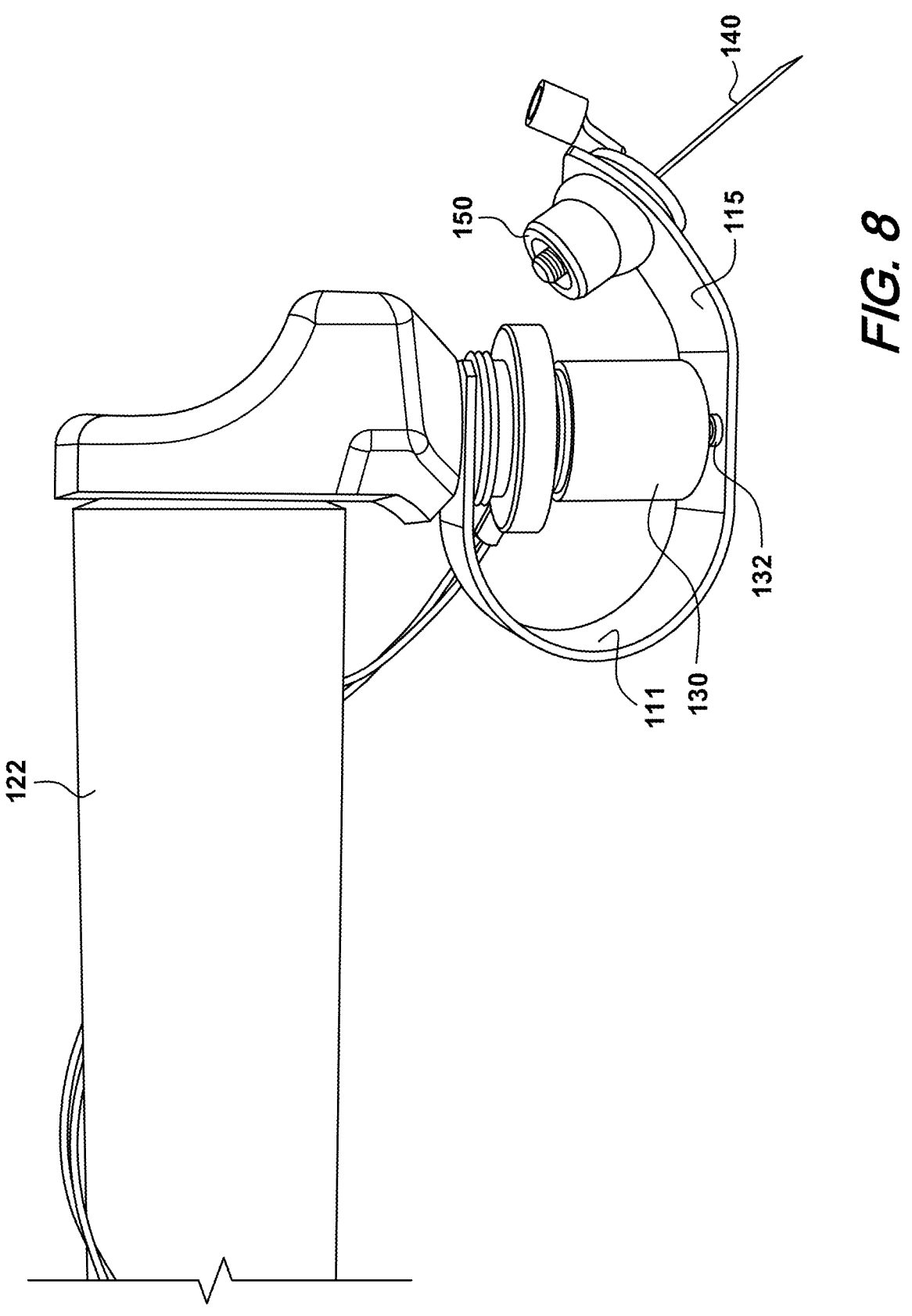
FIG. 8 shows a side view of a variation of the illustrative prototype leaf spring prober of FIG. 4 according to aspects of the present disclosure.

FIG. 8 shows a side view of a variation of the illustrative prototype leaf spring prober of FIG. 4 according to aspects of the present disclosure. With reference to that figure, it may be observed that the U-shaped leaf spring 111 is formed to be considerably more compact than the embodiments previously shown and described. In addition, there is no recurve portion at a distal end of the U-shaped leaf spring.

As a result, the needle 140 is shown connected to the distal end 115 of the U-shaped spring, illustratively shown held in place by a threaded nut configuration 150 that is insulated from the spring itself. Like the previous configuration, the actuator 130 is positioned such that when activated it urges against the spring in two locations including the dimple, 132, resulting in a downward displacement of the needle 140.

Figure 9:
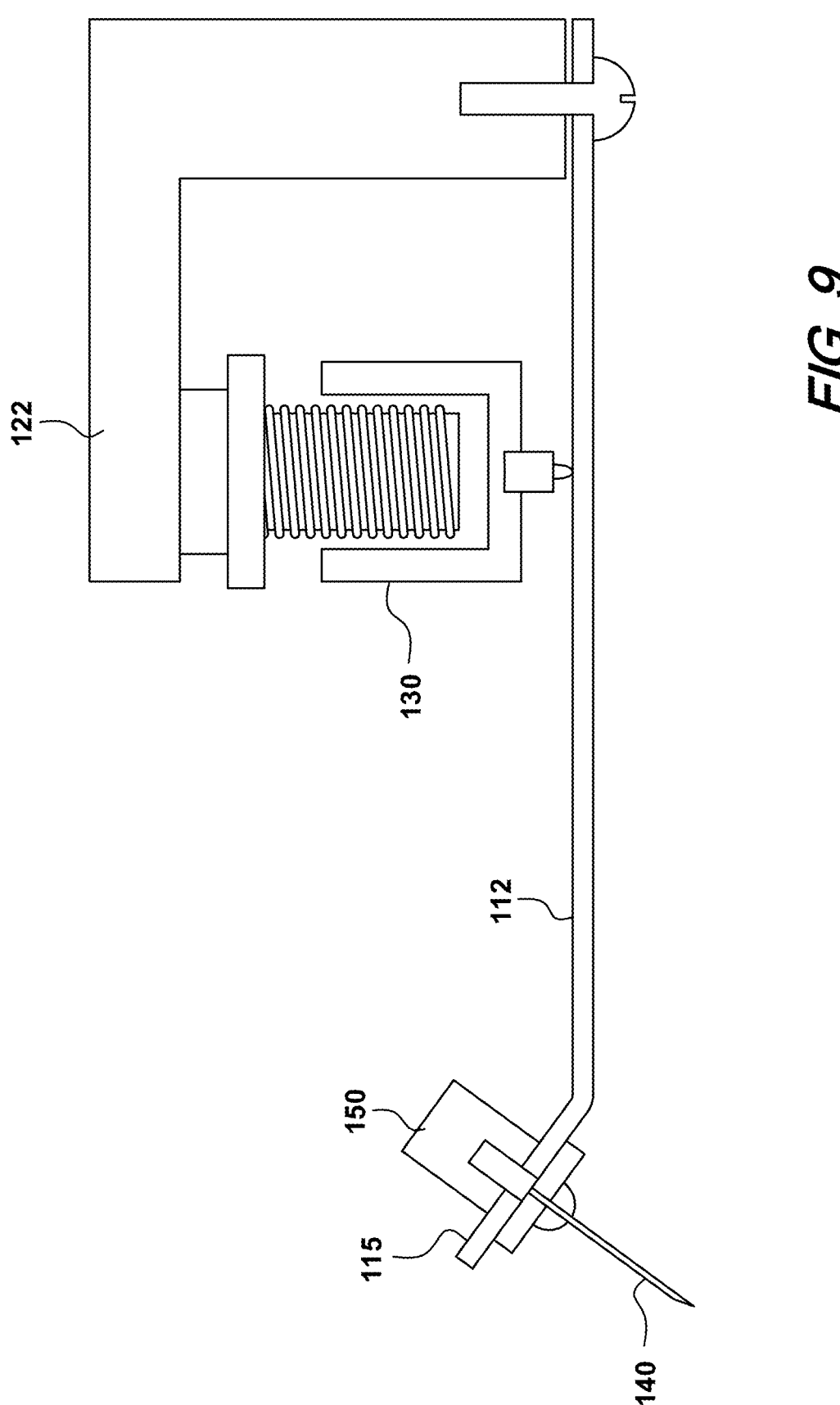
FIG. 9 shows a side view of an alternative embodiment of an illustrative prototype leaf spring prober including a horizontal leaf spring according to aspects of the present disclosure.

FIG. 9 shows a side view of an alternative embodiment of an illustrative prototype leaf spring prober including a horizontal leaf spring according to aspects of the present disclosure. In this illustrative alternative embodiment, a substantially flat spring 112 is mounted at one end to a stage 122 while the other, opposite end 115 has mounted thereto a needle probe 150. As illustratively shown, the end having the needle mounted is curved—in this illustration up—to provide a desired angle to the needle. When the actuator 130 is operated, it urges the spring 112 downward from stage 122 to which one end of the actuator is mounted. Shown further is a near, proximal, end of the spring affixed to a portion of the stage by a fastener that may include a screw, bolt/nut, rivet, or other known fastener.

Figure 10:
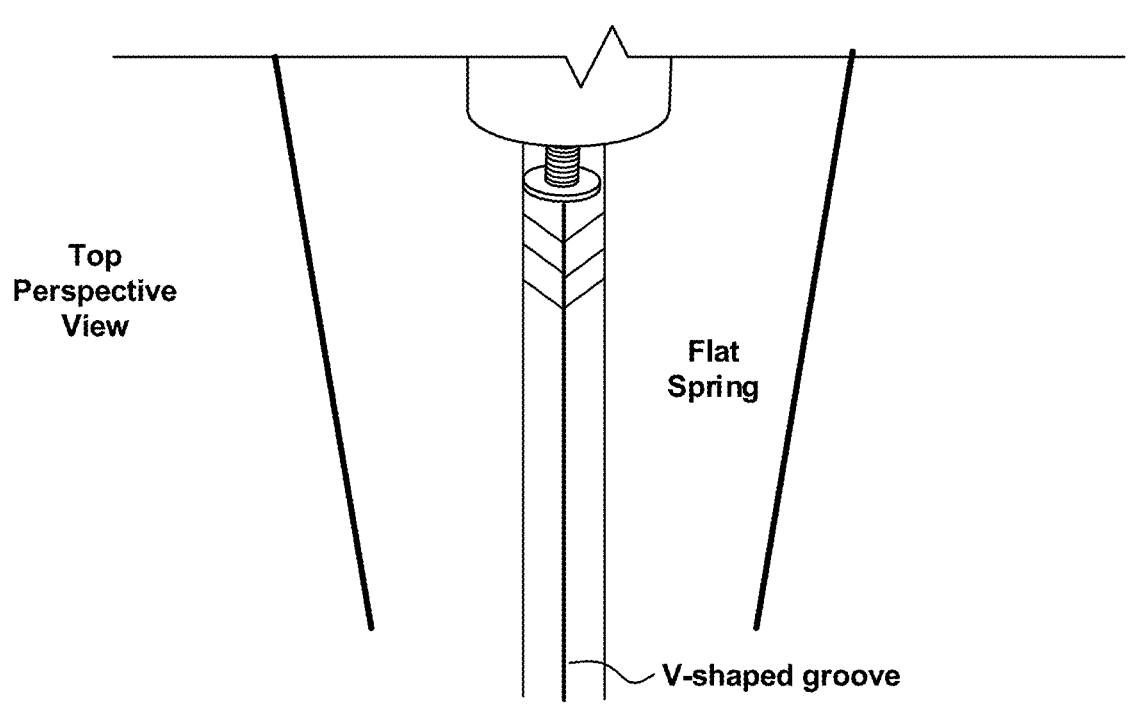
FIG. 10 shows a top perspective view of a flat spring portion including V-shaped groove formed in substantially a central portion of the flat spring portion that receives a piston/shaft of an actuator and a cross-sectional view of that flat spring portion and V-shaped groove according to aspects of the present disclosure.
Figure 10:
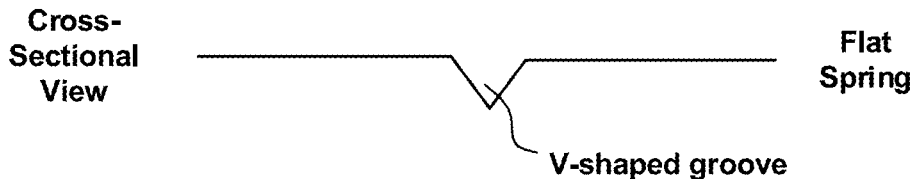

FIG. 10 shows a top perspective view of a flat spring portion including V-shaped groove formed in substantially a central portion of the flat spring portion that receives a piston/shaft of an actuator and a cross-sectional view of that flat spring portion and V-shaped groove according to aspects of the present disclosure. As those skilled in the art will understand and appreciate, the formation of such a V-shaped groove along a central portion of the flat spring results in additional stiffness to the spring while providing a receiver for the actuator piston/shaft.

Figure 11:
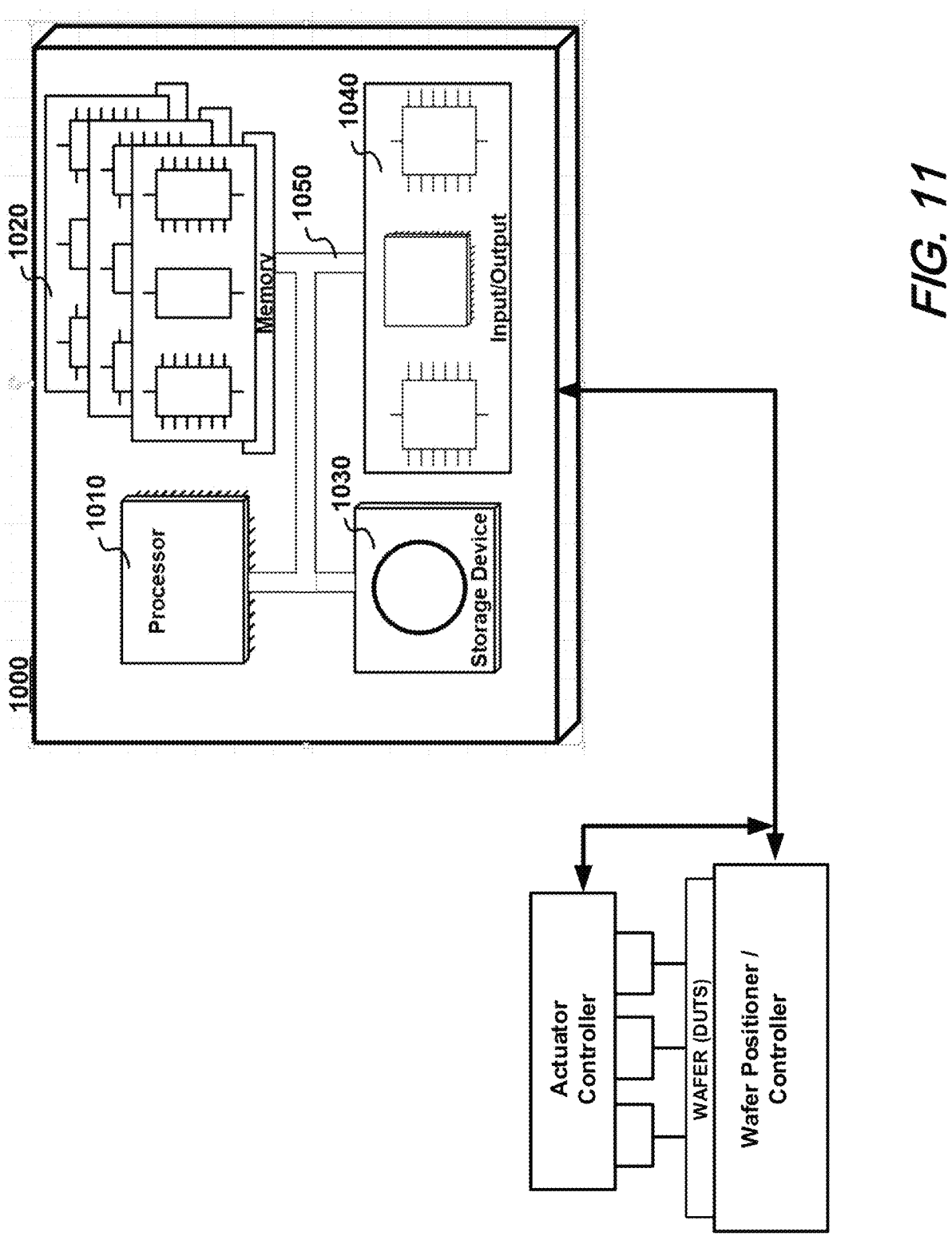
FIG. 11 is a schematic block diagram of an illustrative computer system that may be employed to operate/control an automated test arrangement including leaf spring probers according to aspects of the present disclosure.

FIG. 11 is a schematic block diagram of an illustrative computer system that may be employed to operate/control an automated test arrangement including leaf spring probers according to aspects of the present disclosure. Shown in the figure is an illustrative computer system 1000 suitable for implementing methods and systems according to an aspect of the present disclosure. As may be immediately appreciated, such a computer system may be integrated into another system and may be implemented via discrete elements or one or more integrated components. The computer system may comprise, for example a computer running any of several operating systems. The above-described methods of the present disclosure may be implemented on the computer system 1000 as stored program control instructions.

Computer system 1000 includes processor 1010, memory 1020, storage device 1030, and input/output structure 1040. One or more input/output devices may include a display 1045. One or more busses 1050 typically interconnect the components, 1010, 1020, 1030, and 1040. Processor 1010 may be a single or multi core. Additionally, the system may include accelerators etc further comprising the system on a chip.

Processor 1010 executes instructions in which embodiments of the present disclosure may comprise steps described in one or more of the Drawing figures. Such instructions may be stored in memory 1020 or storage device 1030. Data and/or information may be received and output using one or more input/output devices.

Memory 1020 may store data and may be a computer-readable medium, such as volatile or non-volatile memory. Storage device 1030 may provide storage for system 1000 including for example, the previously described methods. In various aspects, storage device 1030 may be a flash memory device, a disk drive, an optical disk device, or a tape device employing magnetic, optical, or other recording technologies.

Input/output structures 1040 may provide input/output operations for system 1000.

A computer system such as that shown may be advantageously interfaced with a voice coil (or other actuator) control circuit. In this inventive manner the computer may control the voice coil actuator(s) and initiate/control/collect data/analyze test results from a device under test. As illustratively shown in the figure, the actuator controller may actuate/control one or more actuators under computer control such that they contact a wafer including devices under test. The wafer may likewise be positioned under computer control as well. Once the actuators effect probe needles to contact a device under test, the computer may initiate/control/test/collect test data/analyze collected test data to determine electrical/operational characteristics of such device(s) so tested.

At this point, while we have presented this disclosure using some specific examples, those skilled in the art will recognize that our teachings are not so limited. Accordingly, this disclosure should only be limited by the scope of the claims attached hereto.

The invention claimed is:

1. A test probe assembly comprising:
a leaf spring;
a needle probe mechanically attached to a distal end of the leaf spring; and
an actuator operative to deflect a portion of the leaf spring and the attached needle probe;
wherein the leaf spring exhibits a U-shape defining a recurved interior space, the actuator is a voice coil actuator at least partially disposed within the recurved interior space of the leaf spring, and the needle probe is oriented at an angle relative to a horizontal surface of a device under test such that the needle probe makes a scrubbing contact with the device under test.

2. The test probe assembly of claim 1 wherein the U-shaped leaf spring further includes a stationary member portion, a movable member portion, and a U-bent portion that is bent in the U-shape and located between the stationary member portion and the movable member portion.

3. The test probe assembly of claim 2 wherein the attached needle probe is electrically isolated from the U-shaped leaf spring.

4. The test probe assembly of claim 3 wherein the attached needle probe is configured to be between 0 degrees and 75 degrees relative to a horizontal surface of the device under test.

5. The test probe assembly of claim 4 wherein the actuator includes a fixed portion and a moving portion, the fixed portion contacting the stationary member portion and the moving portion contacting the movable member portion, such that when the actuator is operated, the movable member portion is deflected.

6. The test probe assembly of claim 5 wherein the movable member portion includes a surface recess that receives an end of the moving portion of the actuator.

7. The test probe assembly of claim 6 wherein the leaf spring comprises a thermally stable material.

8. The test probe assembly of claim 7 wherein the test probe assembly comprises a plurality of individual test probes.

9. A method of operating a test probe assembly comprising a U-shaped leaf spring, wherein the U-shape defines a recurved interior space;

a needle probe mechanically attached to a distal end of the leaf spring; and an actuator operative to deflect a portion of the leaf spring and the attached needle probe;

the method comprising positioning a device to be tested proximate to the test probe assembly;

operating the actuator to deflect a portion of the leaf spring and the attached needle probe such that the needle probe mechanically and electrically contacts a test pad on the device to be tested; and conducting a test by applying electrical signals to the device to be tested via the needle probe;

wherein the leaf spring U-shape defines a recurved interior space, the actuator is a voice coil actuator at least partially disposed within the recurved interior space of the leaf spring, and the needle probe is oriented at an angle relative to a horizontal surface of the device under test such that the needle probe makes a scrubbing contact with the device to be tested.

10. A computer-implemented test system comprising:

a U-shaped leaf spring;

a needle probe mechanically attached to a distal end of the leaf spring; and an actuator operative to deflect a portion of the leaf spring and the attached needle probe; and a computer operatively connected to the actuator and needle probe and programmed to execute a computer program which when executed causes positioning a device to be tested proximate to the test probe assembly;

operating the actuator to deflect a portion of the leaf spring and the attached needle probe such that the needle probe mechanically and electrically contacts a test pad on the device to be tested; and conducting a test by applying electrical signals to the device to be tested via the needle probe;

wherein the leaf spring U-shape defines a recurved interior space, the actuator is a voice coil actuator at least partially disposed within the recurved interior space of the leaf spring, and the needle probe is oriented at an angle relative to a horizontal surface of the device under test such that the needle probe makes a scrubbing contact with the device to be tested.

11. A non-transitory computer storage medium having computer executable instructions which when executed by a computer cause the computer to perform operations for a computer-implemented test system comprising:

a U-shaped leaf spring;

a needle probe mechanically attached to a distal end of the leaf spring; and an actuator operative to deflect a portion of the leaf spring and the attached needle probe; and a computer operatively connected to the actuator and needle probe and when operated according to the executable instructions causes positioning a device to be tested proximate to the test probe assembly;

operating the actuator to deflect a portion of the leaf spring and the attached needle probe such that the needle probe mechanically and electrically contacts a test pad on the device to be tested; and conducting a test by applying electrical signals to the device to be tested via the needle probe;

wherein the leaf spring U-shape defines a recurved interior space, the actuator is a voice coil actuator at least partially disposed within the recurved interior space of the leaf spring, and the needle probe is oriented at an angle relative to a horizontal surface of the device to be tested such that the needle probe makes a scrubbing contact with the device to be tested.

12. A test probe arrangement comprising:

a leaf spring;

a needle probe mechanically attached to a distal end of the leaf spring; and an actuator operative to deflect a portion of the leaf spring and the attached needle probe;

wherein the distal end of the leaf spring is bent, such that the attached needle probe is less than 90 degrees off horizontal;

wherein the leaf spring exhibits a U-shape that defines a recurved interior space, the actuator is a voice coil actuator at least partially disposed within the recurved interior space of the leaf spring, and the needle probe is oriented at an angle relative to a horizontal surface of a device under test such that the needle probe makes a scrubbing contact with the device under test.

13. The test probe arrangement of claim 12 further comprising a stationary stage having a proximal end of the leaf spring attached thereto.

14. The test probe arrangement of claim 13 wherein the attached needle probe is electrically isolated from the leaf spring.

15. The test probe arrangement of claim 14 wherein the attached needle probe is configured to be between 0 degrees and 75 degrees relative to a horizontal surface of the device under test.

16. The test probe arrangement of claim 15 further comprising a stiffening groove formed along a length of the leaf spring.

17. The test probe arrangement of claim 16 wherein the actuator is positioned between the stationary stage and the leaf spring such that the leaf spring and attached needle probe is deflected when the actuator is operated.

18. The test probe arrangement of claim 17 further comprising a receiving dimple formed in a portion of the leaf spring.

19. The test probe assembly of claim 1, wherein the actuator comprises a movable drive element that abuts the leaf spring to apply a drive force in a first direction, and wherein the movable drive element is mechanically uncoupled from the leaf spring in a second direction opposite the first direction, such that the leaf spring returns to a neutral position via a restorative force of the leaf spring itself.

20. The test probe assembly of claim 1 wherein the leaf spring comprises a nickel-iron alloy exhibiting a desirable coefficient of thermal expansion.

* * * * *